(12) United States Patent
Tammaro et al.

(10) Patent No.: US 7,870,701 B2
(45) Date of Patent: Jan. 18, 2011

(54) RADIATION LIMITING OPENING FOR A STRUCTURE

(75) Inventors: Prisco Tammaro, Melrose, MA (US); Edward I. Holmes, Acton, MA (US)

(73) Assignee: Raytheon Company, Waltham, MA (US)

( * ) Notice: Subject to any disclaimer, the term of this patent is extended or adjusted under 35 U.S.C. 154(b) by 1145 days.

(21) Appl. No.: 11/296,244

(22) Filed: Dec. 7, 2005

(65) Prior Publication Data

US 2007/0158914 A1 Jul. 12, 2007

(51) Int. Cl.
*E04C 2/38* (2006.01)
*E06B 3/00* (2006.01)
*H01R 4/00* (2006.01)

(52) U.S. Cl. .............. 52/656.4; 49/501; 49/489.1; 49/484.1; 174/366; 174/367; 277/641; 277/650; 361/818

(58) Field of Classification Search .............. 52/63, 52/656.7, 656.4, 222, 140; 49/501, 379, 49/483.1, 401, 402, 475.1, 489.1, 484.1, 49/498.1; 174/369, 367, 366, 350, 368, 390; 277/650, 652–654, 641, 902
See application file for complete search history.

(56) References Cited

U.S. PATENT DOCUMENTS

| | | | |
|---|---|---|---|
| 3,055,969 A * | 9/1962 | Schaller, Jr. ............. | 174/369 |
| 3,077,250 A * | 2/1963 | Goldberg ................ | 49/484.1 |
| 3,129,278 A * | 4/1964 | Watt, Jr. et al. .......... | 174/366 |
| 3,296,356 A * | 1/1967 | McAdams ............... | 174/367 |
| 3,304,360 A * | 2/1967 | Hadley et al. ............ | 174/367 |
| 3,437,735 A * | 4/1969 | Schaller, Jr. ............. | 174/367 |
| 3,507,974 A | 4/1970 | Clark et al. | |
| 3,812,316 A * | 5/1974 | Milburn ................. | 219/741 |
| 4,069,618 A * | 1/1978 | Geiss .................... | 49/483.1 |
| 4,677,251 A * | 6/1987 | Merewether ............. | 174/368 |
| 4,817,337 A * | 4/1989 | Lahita .................. | 49/483.1 |
| 4,910,920 A * | 3/1990 | Nichols ................. | 49/484.1 |
| 4,929,802 A * | 5/1990 | Schaepers et al. ......... | 174/368 |
| 5,008,486 A * | 4/1991 | Terakawa et al. ......... | 174/368 |
| 5,039,826 A * | 8/1991 | Newland ................ | 174/374 |
| 5,142,101 A * | 8/1992 | Matsuzaki et al. ........ | 174/354 |

(Continued)

FOREIGN PATENT DOCUMENTS

EP 0 269 206 5/1991

(Continued)

OTHER PUBLICATIONS

"Small Profile Internal Box to Box Electromagnetic Compatibility Grounding Gasket," IBM Technical Disclosure Bulletin, International Business Machines Corp., vol. 36, No. 6B, Jun. 1, 1993: pp. 141-142.

*Primary Examiner*—Brian E Glessner
*Assistant Examiner*—Theodore Adamos
(74) *Attorney, Agent, or Firm*—Iandiorio Teska & Coleman (57) ABSTRACT

A radiation limiting opening for a structure includes a door with a gasket which seals against a door frame about the opening. Spaced apart channels in the door frame define a strike plate therebetween. A film made of a material galvanically compatible with the gasket to prevent corrosion is in intimate contact with the strike plate by a seal. This seal lodges an edge of the film in each channel to create a tortuous path for radiation.

37 Claims, 7 Drawing Sheets

U.S. PATENT DOCUMENTS

| | | | | |
|---|---|---|---|---|
| 5,214,242 | A | * | 5/1993 | Gallagher .................... 174/366 |
| 5,262,588 | A | | 11/1993 | Gallagher |
| 5,351,176 | A | | 9/1994 | Smith et al. |
| 5,898,127 | A | * | 4/1999 | Schuhmacher et al. ...... 174/382 |
| 5,899,027 | A | * | 5/1999 | St. Louis ........................ 52/63 |
| 6,519,899 | B1 | * | 2/2003 | Hurzeler ..................... 49/501 |
| 6,639,145 | B1 | * | 10/2003 | Nurmi ........................ 174/387 |
| 6,943,288 | B1 | | 9/2005 | Miska |
| 2003/0167697 | A1 | * | 9/2003 | Hurzeler ..................... 49/501 |
| 2006/0086051 | A1 | * | 4/2006 | Woods et al. ................. 49/394 |

FOREIGN PATENT DOCUMENTS

| | | |
|---|---|---|
| EP | 1471203 A2 | 10/2004 |
| WO | WO 96/25286 A1 | 8/1996 |

* cited by examiner

RADIATION LIMITING OPENING FOR A STRUCTURE

FIELD OF THE INVENTION

This invention relates to radiation shielding, and in one example, to a radiation limited opening for a structure such as a tactical shelter.

BACKGROUND OF THE INVENTION

Military defense programs often employ tactical shelters to house radar transmitters, command and control centers, launching systems, tactical operations systems and the like. The shelters are enclosed structures. Openings, e.g. doors in the shelter provide for ingress and egress to the contents within the shelter or for electrical cable connections. For mobility, the shelters are typically mounted on a motor vehicle such as a high mobility multi-purpose wheeled vehicle (HMMWV) or a tractor-trailer.

Achieving and maintaining radiation shielding in these shelters is a critical but difficult task. Without sufficient shielding, electromagnetic interference and/or electromagnetic pulses (EMI/EMP) can disrupt radio transmissions, communications, and signals, and/or make them ineffective. Additionally, errant transmissions from the shelters can be traced, thus making the shelters subject to detection and action by adversaries. Typically then, such shelters are made of aluminum or aluminum alloys to provide a favorable combination of electromagnetic shielding in a lightweight structure.

The difficulty with aluminum or aluminum alloy shelters is that the shelter door frames or housings corrode over time, especially in corrosive environments including biological, chemical contamination and survivability (BCCS) environments encountered in the field. The dissimilarity of the materials, namely the aluminum shelter and the material of the gasket on the door which seals with the door frame, contributes to this effect. Consequently, performance and survivability are compromised.

Metal plating of the aluminum, for example, is not a practical and viable alternative because it is known that aluminum is galvanically incompatible with almost all other metals. Thus, in an attempt to eliminate this problem, existing designs apply metal spray coatings or metal frame spray compositions to the aluminum. The use of conventional metal spray coatings and compositions on the aluminum based shelters has proven to be less than satisfactory. Metal spray coatings do not have adequate corrosion resistant properties. The metal spray coatings are also galvanically incompatible with the aluminum, and the metal spray coatings typically utilized are also comprised of material dissimilar from the gasket on the shelter door. Thus, over time there is separation between the metal coating or composition and the aluminum. The frames for the shelter doors or panels are particularly susceptible to cracking, erosion and corrosion, especially the strike plates where the door gasket seals against the frame when closed. Therefore, because of the galvanic incompatibility and the dissimilarity between the metal spray coatings and the aluminum and/or the gasket material on the shelter door, shelters which utilize metal spray coatings do not adequately address the problem of decreased shielding effectiveness caused by corrosive attack and/or wear. This failure to provide adequate corrosion resistant properties over time leads to constant maintenance and costly repairs at best, and in the worst case, can lead to negative consequences in the field.

SUMMARY OF THE INVENTION

It is therefore an object of this invention to provide an improved radiation limiting opening for a structure such as an EMI/EMP shelter.

It is a further object of this invention to provide such a radiation limiting opening which is more resistant to cracking and corrosion.

It is a further object of this invention to provide such a radiation limiting opening which is more robust and which requires less maintenance and repairs.

It is a further object of this invention to provide such a radiation limiting opening which provides improved resistance to radiation.

It is a further object of this invention to provide such a radiation limiting opening as an alternative to and improvement over metal spray coatings.

The subject invention results from the realization that improved protection from radiation such as EMI/EMP can be achieved by reducing or eliminating corrosion at openings in tactical shelters used by the military for various operations. More generally, this invention results from the realization that an improved radiation limiting opening for any structure can be achieved by a film of material, galvanically compatible with a gasket about the opening which provides a seal with a door frame, and having the film in intimate contact with a strike plate or area in the door frame and held in place by a seal which lodges edges of the film in spaced apart channels in the door frame.

The subject invention, however, in other embodiments, need not achieve all these objectives and the claims hereof should not be limited to structures or methods capable of achieving these objectives.

The subject invention features a radiation limiting opening for a structure including a door with a gasket which seals against a door frame about the opening. Spaced apart channels in the door frame define a strike plate therebetween. A film made of a material galvanically compatible with the gasket prevents corrosion and is in intimate contact with the strike plate by a seal lodging an edge of the film in each channel creating a tortuous path for radiation. In one embodiment the gasket includes a weather strip component and a radiation component. The channels may have straight parallel sides joined by a straight bottom perpendicular to the sides, or the channels may have angled sides. In one example, the film is made of copper and the gasket includes tin plated beryllium-copper material. The film may be copper foil. One of the film and the gasket may include a nickel copper alloy and the other of the film and the gasket may include a nickel copper alloy, copper, or beryllium-copper. In one preferred embodiment, the seal includes a wire press fit in the spaced apart channels. The wire may be made of steel or beryllium-copper. The seal may include a wire in the spaced apart channels and at least one mechanical fastener. The door may be hinged to the frame, and the door frame may be made of an aluminum alloy. In one example the radiation limiting opening may include a sealant over each channel. The door frame may include corners and the film may be configured to form a lap joint at least one of the corners. The lap joint may include grooves. The door frame may include corners and the film may include mitered ends at at least one of the corners.

This invention also features a radiation limiting opening for a structure including a door frame about an opening defining a strike plate against which a gasket seals. A film on the strike plate is made of material galvanically compatible with the gasket to prevent corrosion and there is a means for maintaining intimate contact between the film and the strike plate. The means for maintaining intimate contact preferably includes a channel in the door frame on each side of the strike plate and a seal lodging edges of the film in each channel.

This invention further features a radiation limiting opening for a structure including a frame about the opening, spaced apart channels in the frame defining a strike plate therebetween, a film in intimate contact with the strike plate, and a seal lodging each edge of the film in a channel. The radiation limiting opening may further include a gasket made of a material galvanically compatible with the film, and the gasket may seal against the film.

This invention also features a tactical shelter including at least one radiation limiting opening which includes a door with a gasket which seals against a door frame about the opening, spaced apart channels in the door frame defining a strike plate therebetween, and a film made of material galvanically compatible with the gasket to prevent corrosion. The film is in intimate contact with the strike plate by a seal lodging an edge of the film in each channel creating a tortious path for radiation. The gasket may include a weather strip component and a radiation component. The channels may have straight parallel sides joined by a straight bottom perpendicular to the sides or the channels may have angled sides. In one example the film is made of copper and the gasket includes tin plated beryllium-copper material. The film may be copper foil. In one embodiment, one of the film and the gasket includes a nickel copper alloy and the other of the film and the gasket includes a nickel copper alloy, copper, or beryllium-copper. In one preferred variation, the seal includes a wire press fit in the spaced apart channels. The wire may be made of steel or beryllium-copper. The seal may include a wire in the spaced apart channels and at least one mechanical fastener. The door may be hinged to the frame, and the door frame may be made of an aluminum alloy. The tactical shelter may further include a sealant over each channel. The door frame may include corners and the film may be configured to form a lap joint at least one of said corners. The lap joint may include grooves. The door frame may include corners and the film may include mitered ends at least one of said corners. In one preferred example the tactical shelter is an EMI/EMP shelter.

This invention further features a method of fabricating a radiation limiting opening for a door frame sealed by a gasket. The method includes creating spaced apart channels in the door frame, the spaced apart channels defining a strike plate therebetween, placing a film of material galvanically compatible with the gasket on the strike plate, and lodging each edge of the film in the spaced apart channels to create a tortious path for radiation. The gasket may include a weather strip component and a radiation component. In one embodiment the channels have straight parallel sides joined by a straight bottom perpendicular to the sides, and in another embodiment the channels have angled sides. The film may be made of copper and the gasket may include tin plated beryllium copper material. The film may be copper foil. In one example, one of the film and the gasket includes a nickel copper alloy and the other of the film and the gasket includes a nickel copper alloy, copper, or beryllium-copper. Preferably, the method further includes placing a wire over the film and press fitting the wire in the spaced apart channels. The wire may be made of steel or beryllium-copper. The wire may be fastened in the spaced apart channels. The door frame may be made of an aluminum alloy. The method may further include disposing a sealant over each channel. In one variation, the method includes configuring the film to form a lap joint at least one corner of the door frame, and the lap joint may include grooves. In another variation, the method may include configuring the film to form mitered ends at least one corner of the door frame.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
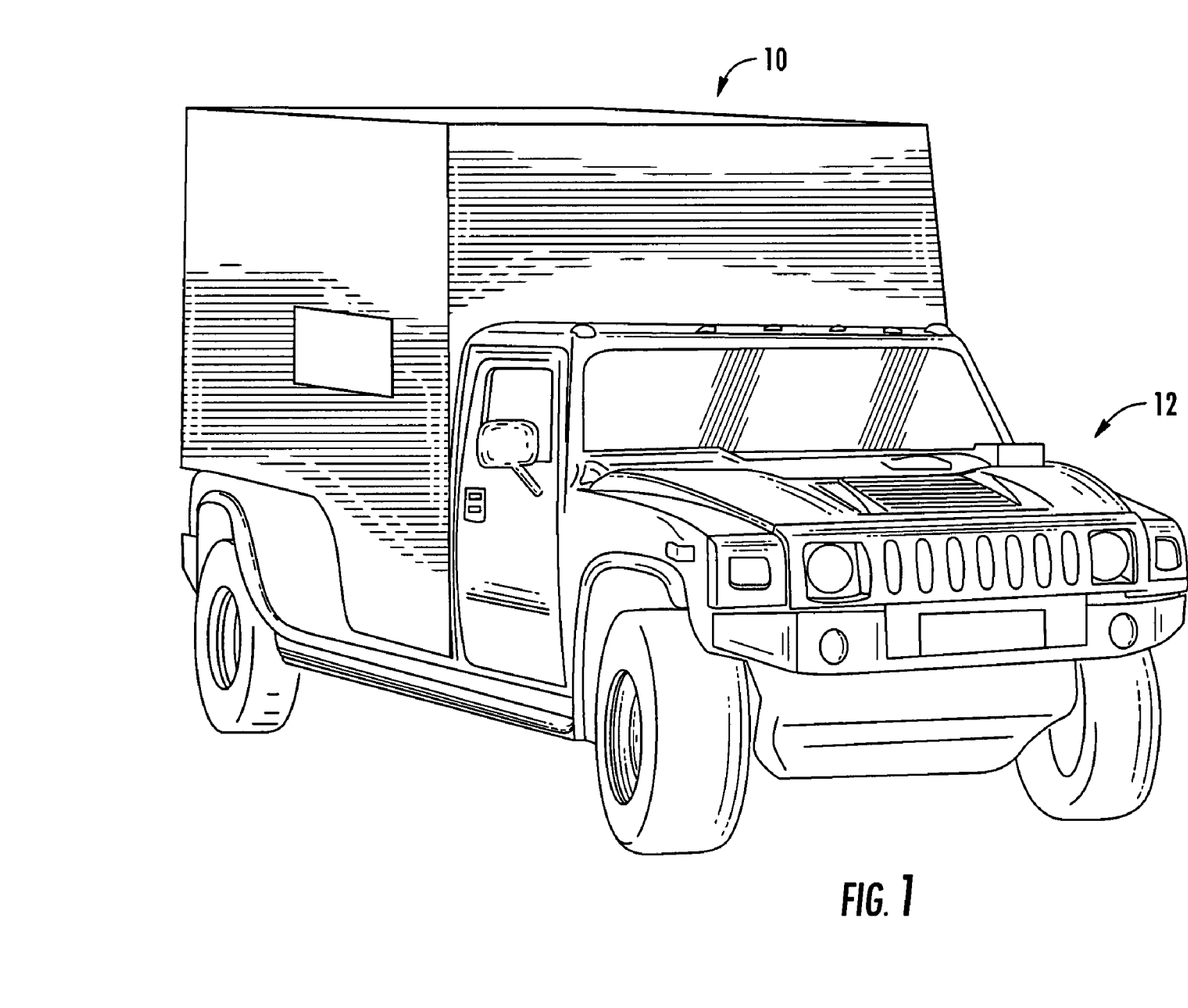
FIG. 1 is a schematic representation of one example of a tactical shelter on a motor vehicle which may include the radiation limiting opening of the subject invention.

As discussed in the Background section above, tactical shelter 10 such as an EMI/EMP shelter, FIG. 1 is an enclosed structure which houses various military systems including transmitters and receivers. For mobility, tactical shelter 10 is mounted on vehicle 12 such as a HMMWV as shown, or a tractor-trailer, for example. Tactical shelter 10 must shield its contents from radiation, including EMI/EMP, and must prevent errant transmissions from escaping. Thus, tactical shelter 10 is typically made of aluminum or aluminum alloys.

Figure 2:
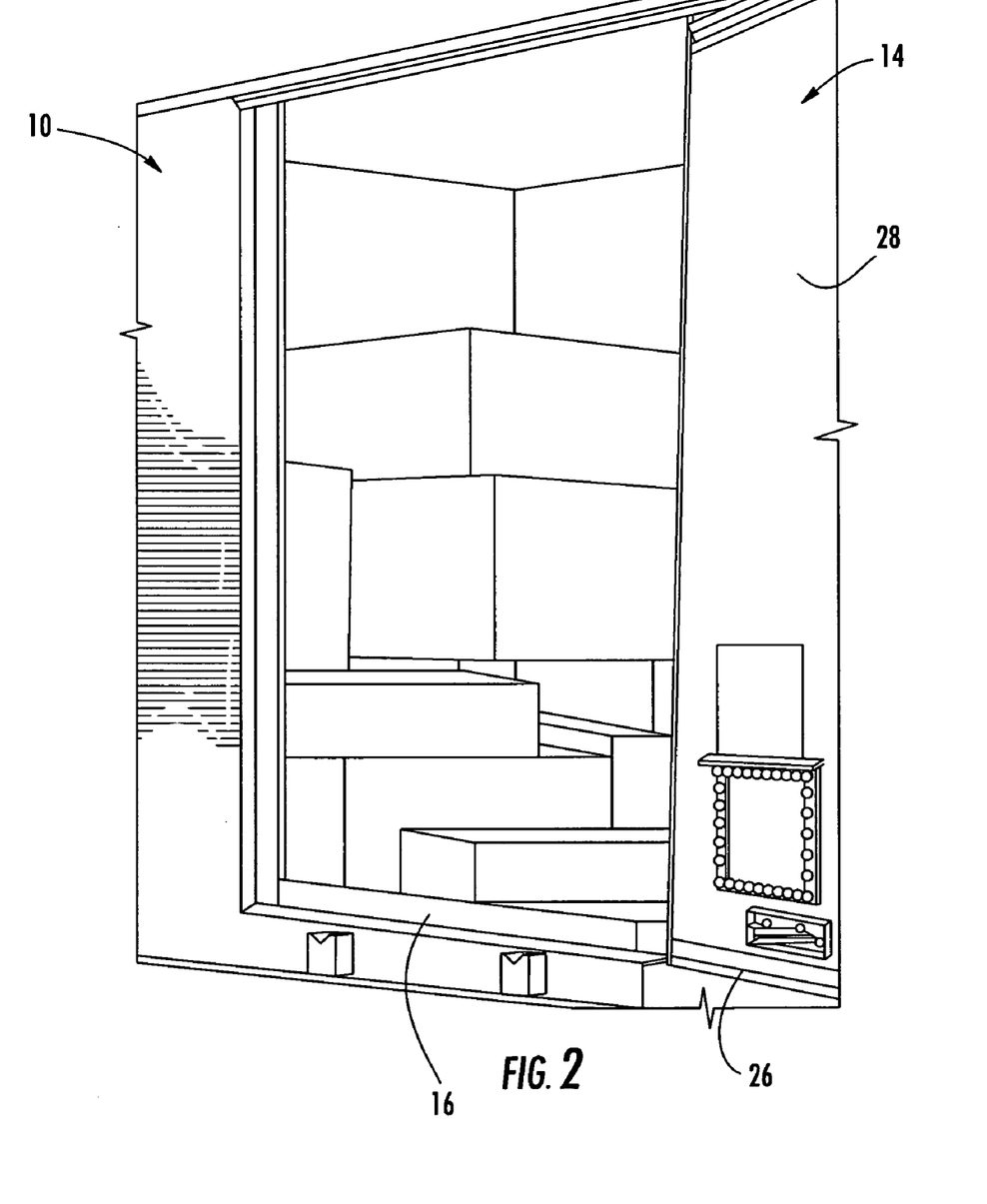
FIG. 2 is schematic enlarged view of one opening in one door on the tactical shelter of FIG. 1.

Rear main door 14, FIG. 2 of tactical shelter 10 provides a means to gain access to the equipment inside as shown. Other doors may provide access to electrical connections. Door frame 16 is highly susceptible to corrosion and/or wear and tear, creating a weak point in the shielding of tactical shelter 10.

In conventional tactical shelters, a metal spray coating or metal flame spray composition was sprayed directly onto the aluminum material of door frame 16. Gasket 26, which is typically attached to the adjoining door or panel 28, contacts with the spray coating on door frame 16. Because aluminum is galvanically incompatible with virtually all shielding metal including the spray coating, and because of the dissimilarity of the spray coating or composition materials and the aluminum door frame and gasket 26, over time the metal spray coating separates from the aluminum. Consequently, cracking and erosion ensue and corrosion occurs. The shielding properties of the shelter are decreased, with adverse consequences.

A radiation limiting opening in accordance with this invention—which may be used with a tactical shelter such as an EMI/EMP shelter as discussed above, or any other structure which serves to shield its contents—provides improved shielding against radiation and is more resistant to cracking, erosion and corrosion.

Figure 3:
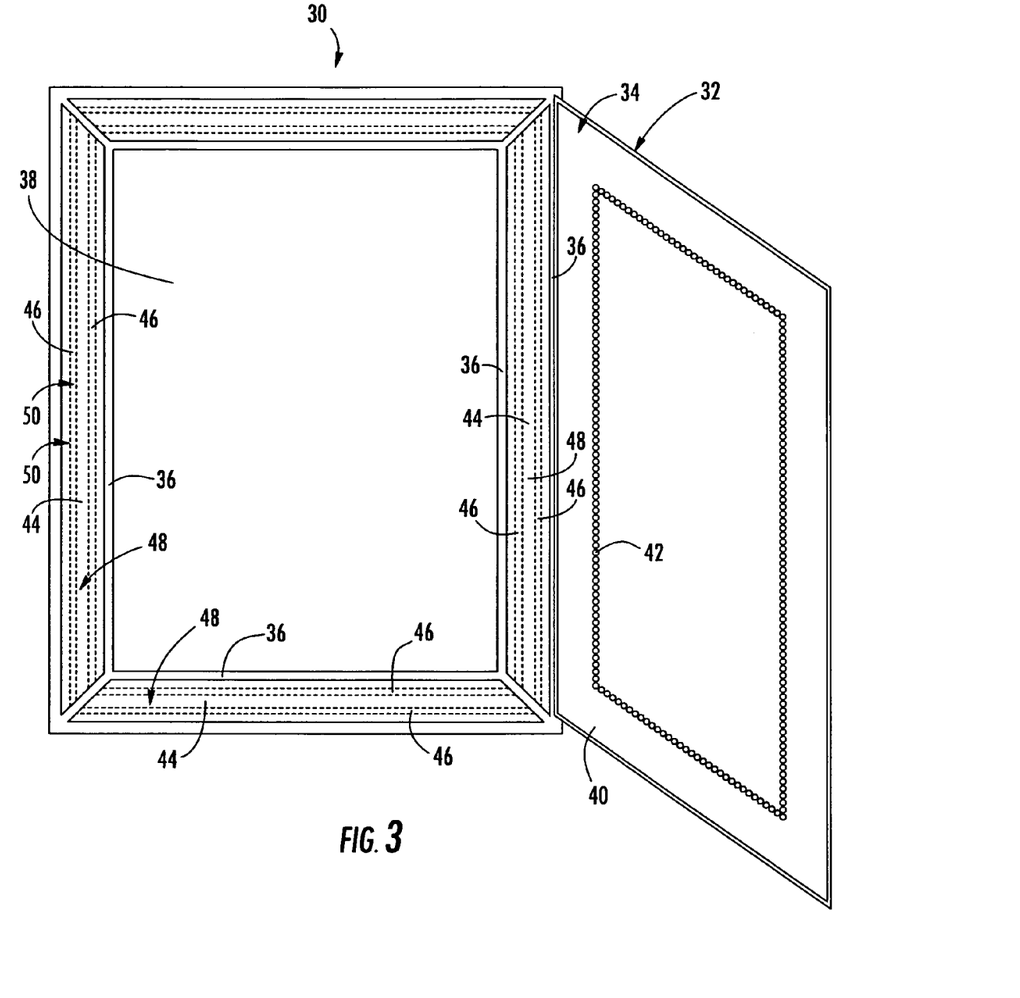
FIG. 3 is a schematic view of one embodiment of a radiation limiting opening in accordance with the present invention.

One example of a radiation limiting opening 30 in accordance with the present invention is shown in FIG. 3. As shown, door 32 is open. When access to the structure is not necessary and when maximum shielding is desired, door 32 with peripheral gasket 34 seals against door frame 36 about opening 38. Door 32 may be hinged to frame 36 or otherwise connected to it. Gasket 34 includes a weather strip component 40 as well as a radiation component 42. In one example for protection against EMI, gasket 34 is an EMI gasket including a weather strip component 40 made of rubber or other material to keep out various meteorological conditions, and radiation component 42 including self-cleaning metal spring fingers to repel electromagnetic interference. It is this radiation component, which is typically made of metal which is dissimilar to the metal spray coating as well as the door, that causes difficulty in conventional shelters.

With the subject invention, however, to prevent corrosion, film 44 on strike plate or area 48 is chosen to be material galvanically compatible with gasket 40. Film 44 is in intimate contact with strike plate 48, and thus gasket 34 will seal against film 44 on door frame 36. In one preferred embodiment film 44 is made of copper and gasket 40 includes radiation component 42 which includes tin plated beryllium-copper material. Preferably, film 44 is copper foil, which is durable—in contrast to metal sprays—and ductile. In another example, one of film 44 and radiation component 42 of gasket 34 includes a nickel copper alloy—such as MONEL®—and the other of film 44 and radiation component 42 of gasket 34 includes a nickel copper alloy—such as MONEL®—or copper or beryllium-copper. Notably, with the unique design of this invention, it does not matter whether the door frame or other such structure is made of aluminum or any other material. The subject invention will work equally well with any such material, so long as film 44 is galvanically compatible with the material of gasket 40. This allows for selection of materials optimized for EMI/EMP shielding, wear resistance and corrosion resistance, depending on a particular desired application, without regard to galvanic corrosion. In a preferred example, however, such as when the radiation limited opening of the subject invention is part of a tactical shelter, door frame 36 is made of aluminum or an aluminum alloy.

Figure 4:
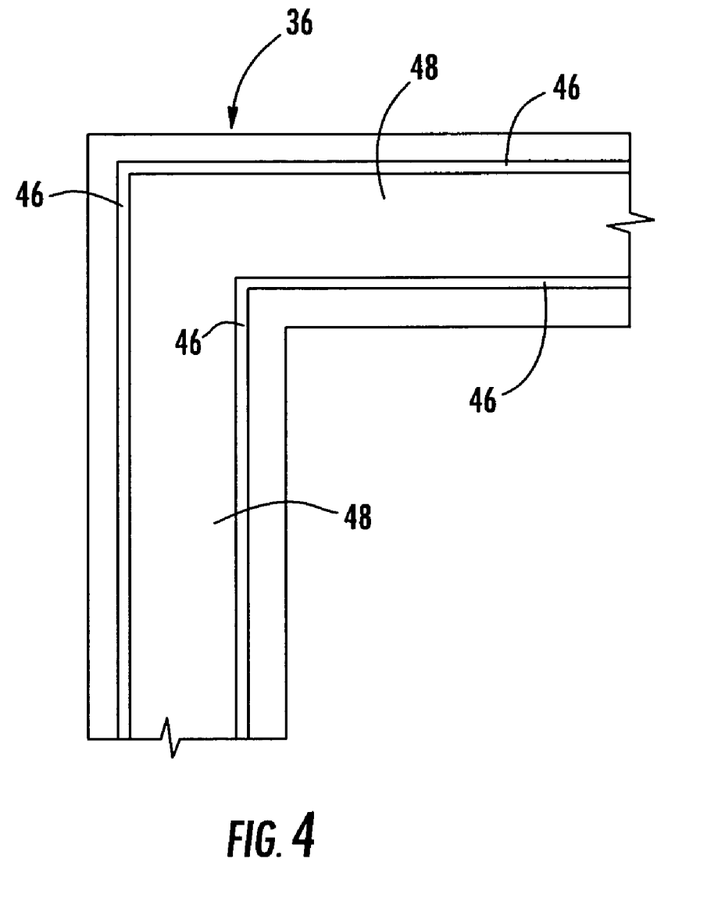
FIG. 4 is a schematic enlarged more detailed partial view of the radiation limiting opening of FIG. 3 showing spaced apart channels.

Typically, spaced apart channels or grooves 46 are formed in door frame 36, shown in phantom in FIG. 3, to define strike plate 48 therebetween. As shown, strike plate 48 is underneath film 44. For clarity, spaced apart channels 46 and strike plate 48 are shown in FIG. 4 without film 44.

Figure 5:
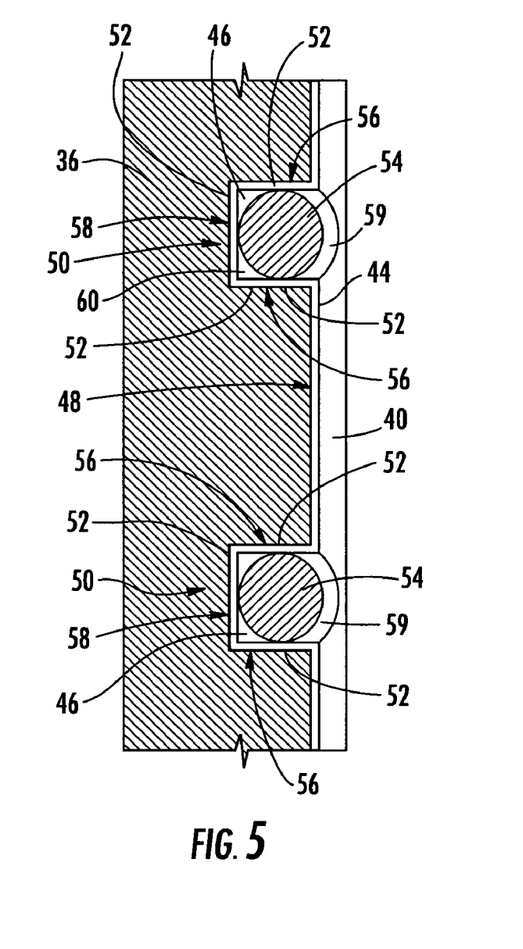
FIGS. 5-6 are schematic detailed cross-sectional views of various examples of the radiation limiting opening in accordance with the present invention.

Film 44, FIG. 3 is preferably held in intimate contact against strike plate 48 in one example by seal 50, FIG. 5 which lodges edge 52 of film 44 in each channel 46. In one embodiment seal 50 is a wire or lock wire press fit or interference fit in spaced apart channels 46. In one variation, channels 46 have straight parallel sides 56 joined by straight bottom 58 perpendicular to sides 56. With film 44, FIG. 3 between strike plate 48 of door frame 36 and gasket 40, door frame 36 and gasket 40 are galvanically isolated. This alleviates the prior problem of dissimilar door structure material and gasket material, while still maintaining metal-to-metal contact, i.e. film to door frame contact.

Figure 6:
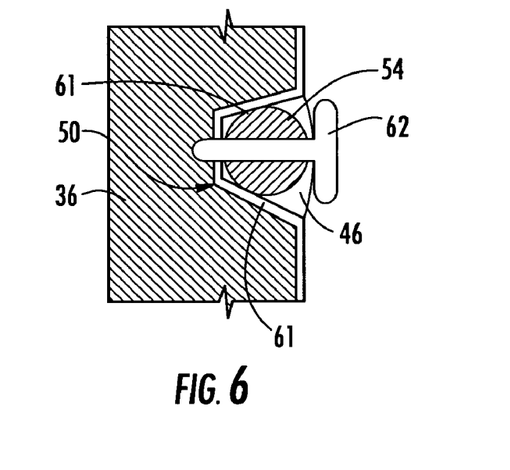

The radiation limiting opening of this invention including seal 50, FIG. 6 with strike plate 48 and edge 52 of film 46 in channels 46 also creates a tortuous or serpentine path for any radiation which may permeate into apertures 60 between sides 56 of spaced apart channels 46 and wire 54. The small aperture size and the tortuous path serve as an additional measure of protection, in addition to door frame 36 and film 44, because any incident radiation will reflect off of sides 56 and bottom 58 and be dissipated in this way. Additionally, in one example, sealant 59 is placed over each channel 46 to hermetically seal the channel, wire and film from the environment. Additionally, wire 54 is typically made of metal such as steel or beryllium-copper and sealant 59 can protect seal 50 and wire 54 during "washdowns", for example, when tactical shelters are subjected to harsh chemicals and cleaning agents. If wire 54 is steel, this offers enhancement and shielding effectiveness at lower frequencies. Sealant 59 is typically non-conductive, such as epoxy or other suitable material.

In one alternative embodiment channel 46 includes angled sides 61, or seal 50, FIG. 6 includes wire 54 in channel 46 and at least one mechanical fastener 62.

Figure 7:
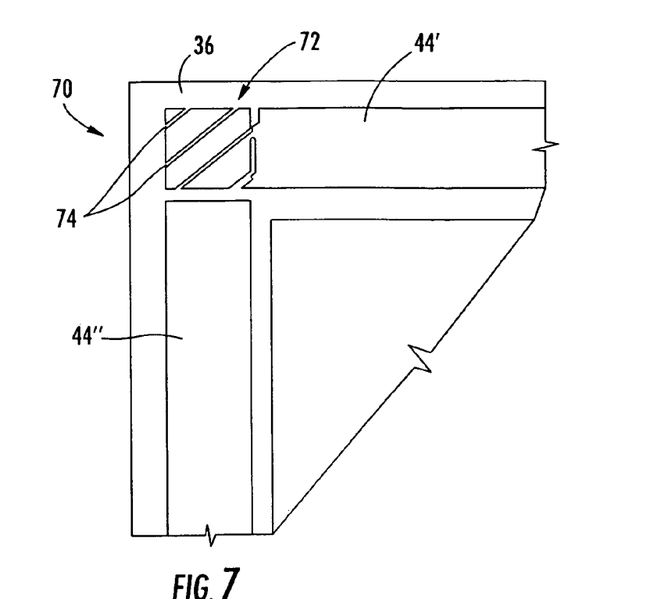
FIGS. 7-9 are schematic partial views of various configurations of the radiation limiting opening of the present invention at door framer corners.
Figure 8:
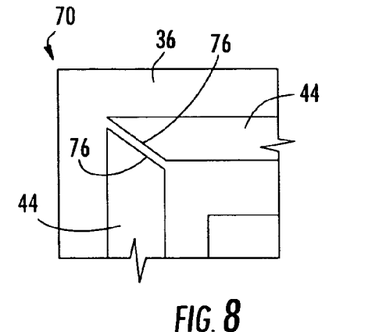
Figure 9:
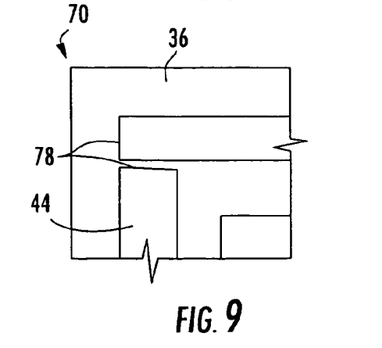

Door frame 36, FIG. 7 typically includes corners 70, and in one example film 44 is configured to form a lap joint 72 at least one corner 70 of door frame 36. In this configuration, two portions of film 44' and 44" overlap at lap joint 72, and the lap joint includes grooves 74. In one variation film 44, FIG. 8 includes mitered ends 76 at least one corner 70. In another variation film 44, FIG. 9 includes straight ends 78 at least one corner 70.

Another aspect of the present invention includes a tactical shelter itself, such as a tactical shelter described herein and shown in FIG. 1 for example, including the radiation limiting opening invention as described herein.

In each embodiment, the radiation limiting opening as well as the tactical shelter in accordance with the present invention each provides the advantage of reducing or eliminating corrosion and its effects.

Figure 10:
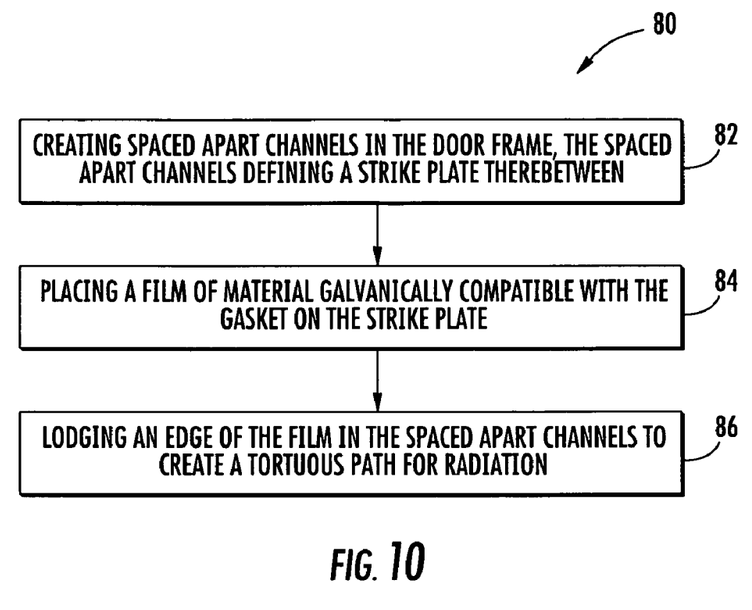
FIG. 10 is a flow chart depicting the primary steps associated with one example of a method of fabricating a radiation limiting opening for a door frame sealed by a gasket.

Moreover, in accordance with the present invention, a method of fabricating a radiation limited opening for a door frame sealed by a gasket may include the radiation limited opening described herein. One method of fabricating a radiation limited opening for a door frame sealed by a gasket 80, FIG. 10 includes creating spaced apart channels in the door frame, the spaced apart channels defining a strike plate therebetween, step 82, and placing a film of material galvanically compatible with the gasket on the strike plate, step 84. The method further includes lodging an edge of the film in the spaced apart channels to create a tortuous path for radiation, step 86. In one example, the gasket includes a weather strip component and a radiation component. The channels may have straight parallel sides joined by a straight bottom perpendicular to the sides, or the channels may have angular sides. The film may be made of copper and the gasket may include tin plated beryllium copper material, or one of the film and gasket may include a nickel copper alloy such as MONEL® and the other of the film and the gasket may include a nickel copper alloy such as MONEL®, copper, or beryllium-copper. The method may further include placing a wire over the film and press fitting the wire in the spaced apart channels.

The radiation limiting opening for a structure, the tactical shelter, as well as the methods, all in accordance with the present invention, each provide an improved radiation limiting opening which provides improved resistance to radiation, is more resistant to degradation due to corrosion and wear, is more robust and which requires less maintenance and repairs, and which is an improvement over metal spray coatings.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A radiation limiting opening for a structure comprising:
   a door with a gasket which seals against a door frame about the opening;
   spaced apart channels in the door frame defining a strike area therebetween located to receive the gasket when the door is closed against the door frame; and
   a film made of a material galvanically compatible with the gasket to prevent corrosion and in intimate contact with the strike area by a seal lodging an edge of the film in each channel creating tortuous path for radiation, the film in contact with the gasket when the door is closed.

2. The radiation limiting opening of claim 1 in which the gasket includes a weather strip component and a radiation component.

3. The radiation limiting opening of claim 1 in which the channels have straight parallel sides joined by a straight bottom perpendicular to the sides.

4. The radiation limiting opening of claim 1 in which the channels have angled sides.

5. The radiation limiting opening of claim 1 in which the film is made of copper and the gasket includes tin plated beryllium-copper material.

6. The radiation limiting opening of claim 5 in which the film is copper foil.

7. The radiation limiting opening of claim 1 in which one of the film and the gasket includes a nickel copper alloy and the other of the film and the gasket includes a nickel copper alloy, copper, or beryllium-copper.

8. The radiation limiting opening of claim 1 in which the seal includes a wire press fit in the spaced apart channels.

9. The radiation limiting opening of claim 8 in which the wire is made of steel.

10. The radiation limiting opening of claim 8 in which the wire is made of beryllium-copper.

11. The radiation limiting opening of claim 1 in which the seal includes a wire in said spaced apart channels and at least one mechanical fastener.

12. The radiation limiting opening of claim 1 in which the door is hinged to the frame.

13. The radiation limiting opening of claim 1 in which the door frame is made of an aluminum alloy.

14. The radiation limiting opening of claim 1 further including a sealant over each channel.

15. The radiation limiting opening of claim 1 in which the door frame includes corners and the film is configured to form a lap joint at least one of said corners.

16. The radiation limiting opening of claim 15 in which the lap joint includes grooves.

17. The radiation limiting opening of claim 1 in which the door frame includes corners and the film includes mitered ends at least one of said corners.

18. The radiation limiting opening of claim 1 in which the structure is a tactical shelter.

19. The radiation limiting opening of claim 18 in which the tactical shelter is an EMI/EMP shelter.

20. A radiation limiting opening for a structure comprising:
    a door frame about the opening;
    a door with a gasket which seals against the door frame;
    two parallel spaced apart channels extending around the door frame, said parallel spaced apart channels defining a strike area therebetween;
    a film made of a material galvanically compatible with the gasket to prevent corrosion; and
    a seal lodging an edge of said film in at least one of said spaced apart channels causing intimate contact between said film and said strike area and a creating tortuous path for radiation.

21. A radiation limiting opening for a structure comprising:
    a door frame about the opening;
    a door with a gasket which seals against the door frame;
    spaced apart channels in the door frame defining a strike area therebetween;
    a film made of a material galvanically compatible with the gasket to prevent corrosion, the film disposed between the gasket and the strike area when the gasket seals against the door frame; and
    seals lodging edges of the film in said spaced apart channels for holding the film in intimate contact with the strike plate and creating tortuous path for radiation.

22. A method of fabricating a radiation limiting opening for a structure, the method comprising:
    forming a door with a gasket for sealing against a door frame about the opening;
    creating spaced apart channels in the door frame, the spaced apart channels defining a strike area therebetween located to receive the gasket when the door is closed against the door frame;
    placing a film of material galvanically compatible with the gasket on the strike area; and
    lodging each edge of the film in the spaced apart channels to create a tortuous path for radiation.

23. The method of claim 22 in which the gasket includes a weather strip component and a radiation component.

24. The method of claim 22 in which the channels have straight parallel sides joined by a straight bottom perpendicular to the sides.

25. The method of claim 22 in which the channels have angled sides.

26. The method of claim 22 in which the film is made of copper and the gasket includes tin plated beryllium copper material.

27. The method of claim 26 in which the film is copper foil.

28. The method of claim 22 in which one of the film and the gasket includes a nickel copper alloy and the other of the film and the gasket includes a nickel copper alloy, copper, or beryllium-copper.

29. The method of claim 22 in which a wire is placed over the film and press fit in the spaced apart channels.

30. The method of claim 29 in which the wire is made of steel.

31. The method of claim 29 in which the wire is made of beryllium-copper.

32. The method of claim 22 in which a wire is fastened in the spaced apart channels.

33. The method of claim 22 in which the door frame is made of an aluminum alloy.

34. The method of claim 22 further including disposing a sealant over each channel.

35. The method of claim 22 further including configuring the film to form a lap joint at least one corner of the door frame.

36. The method of claim 35 in which the lap joint includes grooves.

37. The method of claim 22 further including configuring the film to form mitered ends at least one corner of the door frame.

* * * * *